United States Patent
Herring et al.

(10) Patent No.: US 11,555,858 B2
(45) Date of Patent: Jan. 17, 2023

(54) SYSTEMS, METHODS, AND STORAGE MEDIA FOR PREDICTING A DISCHARGE PROFILE OF A BATTERY PACK

(71) Applicant: TOYOTA RESEARCH INSTITUTE, INC., Los Altos, CA (US)

(72) Inventors: Patrick K. Herring, Mountain View, CA (US); Muratahan Aykol, Santa Clara, CA (US); Abraham Anapolsky, San Mateo, CA (US)

(73) Assignee: TOYOTA RESEARCH INSTITUTE, INC., Los Altos, CA (US)

( * ) Notice: Subject to any disclaimer, the term of this patent is extended or adjusted under 35 U.S.C. 154(b) by 892 days.

(21) Appl. No.: 16/284,533

(22) Filed: Feb. 25, 2019

(65) Prior Publication Data

US 2020/0271725 A1 Aug. 27, 2020

(51) Int. Cl.
*G01R 31/367* (2019.01)
*G07C 5/08* (2006.01)
*G07C 5/00* (2006.01)
*G01R 31/382* (2019.01)
(Continued)

(52) U.S. Cl.
CPC ......... *G01R 31/367* (2019.01); *G01R 31/382* (2019.01); *G01R 31/396* (2019.01); *G07C 5/008* (2013.01); *G07C 5/0816* (2013.01); *H01M 10/425* (2013.01); *H01M 2010/4271* (2013.01); *H01M 2220/20* (2013.01)

(58) Field of Classification Search
CPC .................................................. G01R 31/367
USPC ........................................................ 702/63
See application file for complete search history.

(56) References Cited

U.S. PATENT DOCUMENTS

| 5,825,156 A | 10/1998 | Patillon et al. |
| 8,190,318 B2 | 5/2012 | Li et al. |
| 8,823,324 B2 | 9/2014 | Brandon, II |

(Continued)

FOREIGN PATENT DOCUMENTS

| CN | 105974327 | 9/2016 |
| WO | 2018095039 | 5/2018 |

OTHER PUBLICATIONS

Kandasamy, Nandha Kumar et al. "Performance Analysis Of Machine-Learning Approaches For Modeling The Charging/Discharging Profiles Of Stationary Battery Systems With Non-Uniform Cell Aging." Batteries, Jun. 11, 2017, https://www.mdpi.com/2313-0105/3/2/18.

(Continued)

*Primary Examiner* — Ricky Go
(74) *Attorney, Agent, or Firm* — Dinsmore & Shohl LLP

(57) ABSTRACT

Systems, methods, and storage media for generating a predicted discharge profile of a vehicle battery pack are disclosed. A method includes receiving, by a processing device, data pertaining to cells within a battery pack installed in each vehicle of a fleet of vehicles operating under a plurality of conditions, the data received from at least one of each vehicle in the fleet of vehicles, providing, by the processing device, the data to a machine learning server, directing, by the processing device, the machine learning server to generate a predictive model, the predictive model based on machine learning of the data, generating, by the processing device, the predicted discharge profile of the vehicle battery pack from the predictive model, and providing the discharge profile to an external device.

20 Claims, 6 Drawing Sheets

(51) Int. Cl.
 H01M 10/42 (2006.01)
 G01R 31/396 (2019.01)

(56) References Cited

U.S. PATENT DOCUMENTS

| | | | | |
|---|---|---|---|---|
| 8,855,954 | B1* | 10/2014 | Bickford | G07C 3/08 |
| | | | | 702/63 |
| 2008/0262668 | A1 | 10/2008 | Yamada | |
| 2016/0239592 | A1 | 8/2016 | Pourmousavi Kani | |
| 2016/0349330 | A1 | 12/2016 | Ronald, Jr. et al. | |
| 2018/0196107 | A1* | 7/2018 | Fleischer | G01R 31/52 |

OTHER PUBLICATIONS

Kandasamy, Nandha Kumar et al. "Data-Driven Model Based Charging Profile Prediction For Energy Storage Systems." Preprints, Oct. 17, 2017, https://www.preprints.org/manuscript/201710.0111/v1.

* cited by examiner

SYSTEMS, METHODS, AND STORAGE MEDIA FOR PREDICTING A DISCHARGE PROFILE OF A BATTERY PACK

BACKGROUND

Field

The present specification generally relates to predicting battery pack characteristics and, more particularly, to systems, methods, and storage media for using machine learning to predict how a particularly configured vehicle battery pack will discharge under various operating conditions.

TECHNICAL BACKGROUND

Battery packs for use in vehicles (e.g., hybrid gas/electric vehicles, electric vehicles, or the like) are generally constructed as a grouping of cells. The arrangement of cells may affect how the vehicle battery pack discharges energy when used, particularly under certain operating conditions. Accordingly, information regarding how certain battery packs discharge energy under certain operating conditions could be useful in ensuring that a particular pack is adequately charged before the vehicle sets out on a particular course, ensuring that a particular pack is used for a particular type of vehicle, and/or ensuring that particular discharge settings are set for a particular use.

SUMMARY

One aspect of the present disclosure relates to a method for generating a predicted discharge profile of a vehicle battery pack. The method includes receiving, by a processing device, data pertaining to cells within a battery pack installed in each vehicle of a fleet of vehicles operating under a plurality of conditions. The data is received from at least one of each vehicle in the fleet of vehicles. The method further includes providing, by the processing device, the data to a machine learning server and directing, by the processing device, the machine learning server to generate a predictive model. The predictive model is based on machine learning of the data. The method further includes generating, by the processing device, the predicted discharge profile of the vehicle battery pack from the predictive model and providing the discharge profile to an external device.

Another aspect of the present disclosure relates to a system configured for generating a predicted discharge profile of a vehicle battery pack. The system includes a fleet of vehicles, each vehicle in the fleet of vehicles comprising a battery pack having a plurality of cells and one or more hardware processors communicatively coupled to each vehicle in the fleet of vehicles. The one or more hardware processors are configured by machine-readable instructions to receive data pertaining to cells within a battery pack installed in each vehicle of a fleet of vehicles operating under a plurality of conditions. The data is received from at least one of each vehicle in the fleet of vehicles. The one or more hardware processors are further configured by machine-readable instructions to provide the data to a machine learning server and direct the machine learning server to generate a predictive model. The predictive model is based on machine learning of the data. The one or more hardware processors are further configured by machine-readable instructions to generate the predicted discharge profile of the vehicle battery pack from the predictive model and provide the discharge profile to an external device.

Yet another aspect of the present disclosure relates to a non-transient computer-readable storage medium having instructions embodied thereon, the instructions being executable by one or more processors to perform a method for generating a predicted discharge profile of a vehicle battery pack. The method includes receiving data pertaining to cells within a battery pack installed in each vehicle of a fleet of vehicles operating under a plurality of conditions. The data is received from at least one of each vehicle in the fleet of vehicles. The method further includes providing the data to a machine learning server and directing the machine learning server to generate a predictive model. The predictive model is based on machine learning of the data. The method further includes generating the predicted discharge profile of the vehicle battery pack from the predictive model and providing the discharge profile to an external device.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

Figure 1:
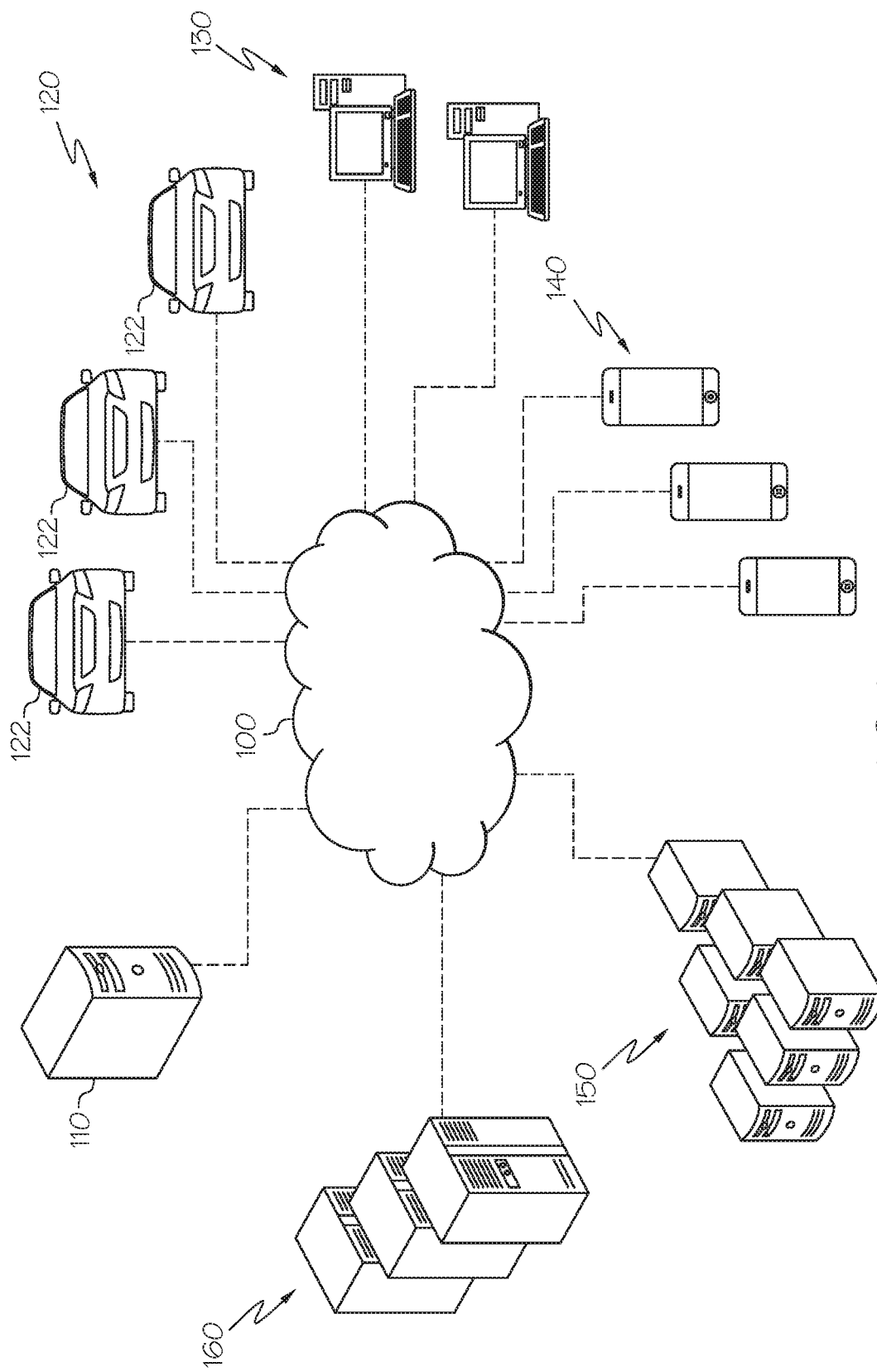
FIG. 1 schematically depicts an illustrative network of devices and systems for predicting a discharge profile of a battery pack under particular operating conditions according to one or more embodiments shown and described herein.

The present disclosure relates generally to training and using a machine learning (ML) model to predict how certain conditions will cause a particular battery pack to discharge, particularly a battery pack found in vehicles such as electric vehicles (EVs), hybrid gas-electric vehicles, and the like. The methods and systems described herein generally include obtaining data pertaining to the cells in battery packs installed in a fleet of currently-operating vehicles, data pertaining to discharge of the cells under real-world conditions, and/or data pertaining to discharge of the cells under simulated conditions. The data is then fed into a ML server, which generates a predictive model that can be used to establish discharge profiles for particular operating conditions.

Battery packs, particularly those used in vehicles such as EVs and hybrid gas-electric vehicles, consist of an arrangement of cells that contain stored energy. The cells are connected in parallel to form a module, and a plurality of modules are connected in series to form a pack. In some cases, the cells are merely arranged within the modules/the battery pack in a manner to maximize the number of cells. As such, every battery pack that is manufactured may not be exactly the same as others due to varying cell arrangements.

In addition, certain cells (including relatively low-quality cells and relatively high-quality cells), when placed next to each other or otherwise arranged in a particular manner, may operate sub-optimally under certain conditions. For example, various cells may release various levels of thermal energy (e.g., give off heat) during operation (including charging and discharging) due to the inherent impedance properties of the cells. When two cells that give off a relatively high amount of heat are placed next to each other (relative to two cells that give off a relatively lower amount of heat), the amount of heat that is released may be high enough to damage the cells and/or surrounding components of the battery pack, particularly when the vehicle is driven in hot weather, which can result in, for example, battery pack failure, reduced lifetime of the battery pack, quicker discharge times, slower charge times, and/or the like. Accordingly, it becomes necessary to space cells exhibiting high resistance apart from one another to maintain an overall temperature of the modules and the pack in general to avoid heat related issues, particularly when the vehicle is driven in hot weather. In another example, it may be preferable to avoid placing a cells having a relative higher capacity adjacent one another in a module or in a pack so as to avoid stressing the relative lower capacity cells also present in the module or in the pack, particularly when the rate of discharge is higher than a typical rate of discharge (e.g., when the vehicle is driven at a higher speed, up a slope, and/or the like). Accordingly, it becomes necessary to space the relative higher capacity cells apart from one another to avoid stress on the relative lower capacity cells under certain operating conditions.

Some systems and methods merely monitor battery pack operation at a pack level (e.g., the battery pack as a whole). Monitoring in this manner is not sufficiently granular to obtain the data that is necessary for machine learning and generation of a model that can be used for configuring cells and modules within a pack.

Referring now to the drawings, FIG. 1 depicts an illustrative network, generally designated 100, of devices and systems for predicting a discharge profile of a battery pack under particular operating conditions according to embodiments shown and described herein. As illustrated in FIG. 1, the network 100 may include a wide area network, such as the internet, a local area network (LAN), a mobile communications network, a public service telephone network (PSTN) and/or other network and may be configured to electronically connect a battery configuration system 110, one or more vehicles 122 in a fleet of vehicles 120, one or more user computing devices 130, one or more mobile devices 140, one or more machine learning servers 150, and/or one or more battery testing devices 160.

The battery configuration system 110 is generally a computing device that carries out various processes for determining an arrangement of cells in a battery pack (including a module thereof) and directs placement of the cells accordingly, as described in greater detail herein. The battery configuration system 110 contains one or more hardware components, as will be discussed herein with respect to FIGS. 3A and 3B.

Still referring to FIG. 1, the fleet of vehicles 120 includes one or more vehicles 122, each of which has at least one battery pack therein. For example, each vehicle 122 in the fleet of vehicles 120 may be an electric vehicle, a gas-electric hybrid vehicle, or the like. Each vehicle 122 in the fleet of vehicles 120 can be communicatively coupled to any of the components within the network 100 to transmit data corresponding to the battery pack, and can further receive instructions for utilizing the battery pack therein, as described in greater detail herein. Accordingly, each vehicle 122 in the fleet of vehicles 120 includes one or more hardware components that are used for generating data, communicating data, receiving commands, and executing commands, as described herein with respect to FIG. 4.

Still referring to FIG. 1, the one or more user computing devices 130 and the one or more mobile devices 140 may generally be devices that are used by a user to transmit information from at least one vehicle 122 in the fleet of vehicles 120 (if the vehicle within the fleet of vehicle is not directly coupled to the network 100) and/or receive information from the battery configuration system 110 (e.g., directions) that is used to arrange the cells within a battery pack (or a module thereof) during manufacture of the battery pack. For example, the one or more user computing devices 130 and/or the one or more mobile devices 140 may be communicatively coupled to a vehicle 122 from the fleet of vehicles 120 to receive data from the vehicle (e.g., via the vehicle's on-board diagnostics (OBD) port) and transmit the data via the network 100 to another device (e.g., the battery configuration system 110). In another example, the one or more user computing devices 130 and/or the one or more mobile devices 140 may be integrated with an electric vehicle charging station such that, when the vehicle 122 is connected to the charging station for a charge, a data connection is created between the vehicle 122 and the charging station (e.g., at least one of the user computing device 130 and the mobile device 140) such that data can be transmitted to one or more other components connected to the network 100 via the charging station. In yet another example, the one or more user computing devices 130 and/or the one or more mobile devices 140 may be located in a vehicle repair facility, vehicle dealership, and/or the like. In yet another example, the one or more user computing devices 130 and/or the one or more mobile devices 140 may be located in a battery manufacturing facility, and may receive instructions that are either displayed to a person assembling a battery pack or provided to a robot assembling a battery pack. The instructions may direct the user or the robot to pick certain cells exhibiting characteristics, place the cells in a particular location or in a particular relation to other cells or other battery components (e.g., sensors, cooling devices, or the like), bend the cells in a particular manner, and/or the like when a particular battery pack is intended to be used for a particular purpose. Each of the one or more user computing devices 130 may generally be any computing device that includes components that allow the device to perform any user-facing functions (e.g., a display, a user input device, memory, processing device, communications ports, and/or the like), and is otherwise not limited by the present disclosure. Similarly, each of the one or more mobile devices 140 may generally be any computing device that includes components that allow the device to perform any user-facing functions (e.g., a display, a user input device, memory, processing device, communications ports, and/or the like), and is otherwise not limited by the present disclosure.

In some embodiments, the one or more user computing devices 130 and/or the one or more mobile devices 140 may gather data that is used for predicting as described herein when the one or more user computing devices 130 and/or the one or more mobile devices 140 are communicatively coupled to a vehicle during servicing. That is, data from full diagnostic cycles may be obtained during vehicle services (e.g., when the vehicle is at the dealership, a repair shop, or the like). In such embodiments, additional external hardware associated with the one or more user computing devices 130 and/or the one or more mobile devices 140 may be used to obtain the data, such as, for example, a connection between the vehicle and a computer that is configured to cause a controlled charge or discharge of the battery while at the same time receiving data from one or more sensors.

The one or more machine learning servers 150 are generally computing devices that store one or more machine learning algorithms thereon and are particularly configured to receive data pertaining to the cells in batteries and generate a model therefrom, the model being useable by the battery configuration system 110 to predict one or more discharge profiles for any battery pack (including battery packs having different arrangements of cells therein) for a one or more operating conditions, as described in greater detail herein. The machine learning algorithms utilized by the one or more machine learning servers 150 are not limited by the present disclosure, and may generally be any algorithm now known or later developed, particularly those that are specifically adapted for generating a predictive model that can be used for estimating electrical characteristics of cells. That is, the machine learning algorithms may be supervised learning algorithms, unsupervised learning algorithms, semi-supervised learning algorithms, and reinforcement learning algorithms. Specific examples of machine learning algorithms may include, but are not limited to, nearest neighbor algorithms, naïve Bayes algorithms, decision tree algorithms, linear regression algorithms, supervised vector machines, neural networks, clustering algorithms, association rule learning algorithms, Q-learning algorithms, temporal difference algorithms, and deep adversarial networks. One particular algorithm may utilize dynamic time warping (DTW). Another particular algorithm may utilize reinforcement, such as a QV-learning algorithm. Other specific examples of machine learning algorithms used by the one or more machine learning servers 150 should generally be understood and are included within the scope of the present disclosure.

The one or more battery testing devices 160 are generally devices that are used to test batteries, generate data corresponding to the battery testing, and supply the data to one or more components communicatively coupled thereto via the network 100 (e.g., the battery configuration system 110). The battery testing devices 160 may generally test batteries or components thereof (e.g., modules, cells, or the like) that are not installed in vehicles (i.e., not contained within one of the vehicles 122). The battery testing devices 160 may test a battery or component thereof for charge, voltage, discharge rate, charging time, life span, physical characteristics, chemical composition, cranking amps, internal battery management systems functionality, and/or the like. The battery testing devices 160 may also simulate various discharge conditions. For example, the battery testing devices 160 may complete an EV Drive Cycle Simulation (e.g., Federal Urban Drive Schedule—FUDS), a Hybrid Pulse Power Characterization (HPPC) test, and/or the like. In embodiments with respect to testing of individual cells, the battery testing devices 160 may be used for electrochemistry, battery, and supercapacitor testing, HPCE measurements, electrochemical research and development, half-cell testing, life cycle testing, electrochemical impedance spectroscopy (EIS), and/or the like. In some embodiments, at least one of the battery testing devices 160 may be a high-throughput (HT) cycler. An illustrative example of one of the battery testing devices 160 is the 9220 Dual Bay Series Low Voltage/High Current Cycler available from NH Research (Irvine, Calif.). Another illustrative example of one of the battery testing devices 160 is the various battery testing products available from Arbin Instruments (College Station, Tex.), such as, for example, the Regenerative Battery Testing (RBT) series of devices.

In some embodiments, the one or more battery testing devices 160 may obtain and/or generate data that is used to predict battery discharge, as described herein. Examples of data that may be obtained and/or generated by the one or more battery testing devices 160 based on a testing of particular battery packs include, but is not limited to, relaxation after high rate pulse discharge data, diagnostic cycle data, and charge cycle data. As described herein, each of the aforementioned data can be linked to higher quality features determined from the one or more battery testing devices 160 (e.g., EIS spectra, C-V curves, and/or the like). Relaxation data may be obtained by the one or more battery testing devices 160 either with a deliberate high current discharge pulse controlled by a motor controller or from a high current discharge (i.e., during acceleration). Charging cycles may yield data that is closest to galvanostatic cycling since the charging typically occurs at constant current or constant power.

It should be understood that while the user computing device 130 is depicted in FIG. 1 as a personal computer and the battery configuration system 110 and the one or more machine learning servers 150 are depicted as servers, these are nonlimiting examples. More specifically, in some embodiments any type of computing device (e.g., mobile computing device, personal computer, server, etc.) may be utilized for any of these components. Additionally, while each of these computing devices is illustrated in FIG. 1 as a single piece of hardware, this is also merely an example. More specifically, each of the battery configuration system 110, the one or more user computing devices 130, the one or more mobile devices 140, and/or the one or more machine learning servers 150 may represent a plurality of computers, servers, databases, or the like.

Figure 2:
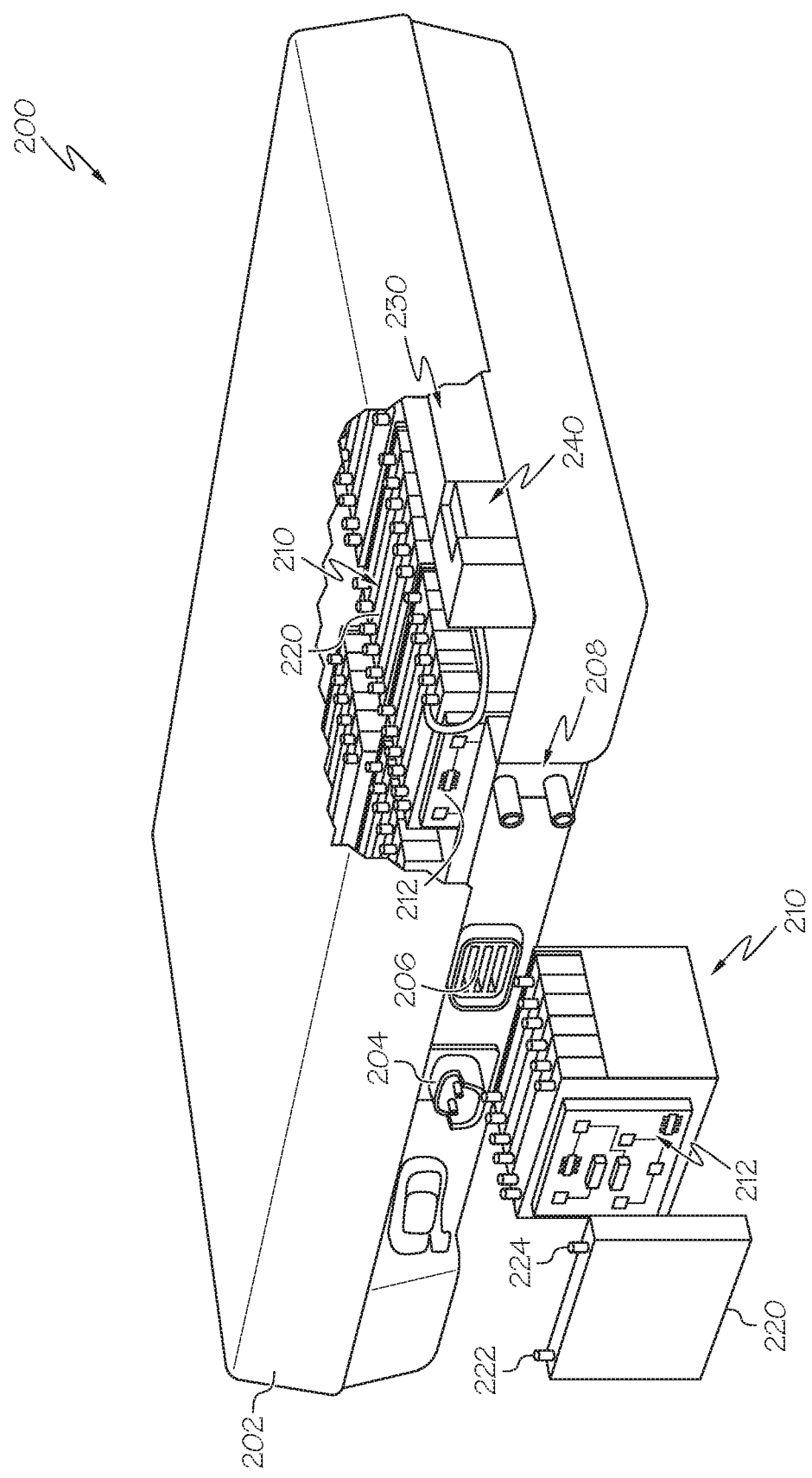
FIG. 2 schematically depicts a perspective view of an illustrative cell, an illustrative module, and an illustrative battery pack having a plurality of cells arranged within a plurality of modules according to one or more embodiments shown and described herein.

FIG. 2 depicts a perspective view of a battery pack 200 containing a plurality of cells 220 arranged within modules 210 therein. FIG. 2 further depicts an illustrative cell 220 and a module 210 that includes a plurality of cells 220 therein. The battery pack 200 depicted in FIG. 2 is an illustrative example of a pack that may be found in a vehicle, such as a vehicle 122 in the fleet of vehicles 120 (FIG. 1). That is, the battery pack 200 may be an energy storage device that is used to power various vehicle components in a vehicle, particularly electric vehicle components, gas-electric hybrid vehicle components, and/or the like. The battery pack 200 depicted in FIG. 2 may also be an illustrative example of a pack that is tested by the one or more battery testing devices 160 (FIG. 1).

Still referring to FIG. 2, in some embodiments, the battery pack 200 may be shaped and/or sized to correspond to a vehicle in which it is installed, and may be configured to house a plurality of the cells 220 and/or the modules 210 therein. The battery pack 200 may include a cover that defines an interior in which the cells 220 and/or modules 210 are contained, along with various other components such as (but not limited to) pack sensor hardware 230 having one or more sensors and/or one or more battery management system (BMS) hardware components 240.

Each of the cells 220 within a module 210 of the battery pack 200 may generally be a battery cell that is used for storing electrical energy that is provided to an external component, such as a component of a vehicle. As such, each of the cells 220 may have a plurality of terminals thereon, including a positive terminal 222 and a negative terminal 224. The cell 220 is otherwise not limited by the present disclosure, and may be any type of battery cell now known or later developed. Illustrative examples of cells include, but are not limited to, lead acid cells, nickel metal hydride (NiMH) cells, lithium ion (Li-ion) cells, and/or the like.

Each of the cells 220 may be any size and/or shape and/or moldable into any size or shape. As such, the present disclosure is not limited to any particular size and shape. Moreover, the modules 210 within the battery pack 200 may have a plurality of cells 220 that have different sizes and shapes. That is, a module 210 may include one or more first cells 220 having a first size and/or shape and one or more second cells 220 having a second size and/or shape that is different from the first size and/or shape. Use of differently shaped cells 220 within a module 210 in various arrangements may allow for the module 210 to be configured in various manners. For example, the module 210 may be molded to fit a particular shape based on the location of that module 210 within the battery pack 200 (e.g., to fit a particularly shaped void, to fit in between particularly shaped components, and/or the like), and the module 210 may be filled with cells 220 having various sizes so as to maximize the number of cells 220 located within the module 210, maximize the amount of energy storage capacity of the module 210, and/or the like. In addition, modules 210 may be subsequently molded and filled with particular cells 220 and/or particular arrangement of cells 220 based on a direction received from the battery configuration system 110 (FIG. 1), as described in greater detail herein. Accordingly, it should be understood that the shape and size of the modules 210 and the cells 220 are not limited by the present disclosure.

In some embodiments, each of the modules 210 may also include a module BMS device 212. The module BMS device 212 may generally be a battery management system that is particularly adapted for the module 210 in which it is located to manage electrical output of the module 210 and/or the cells 220 thereof, manage charging of the module 210 and/or the cells 220 thereof, collect data on a charge and/or a discharge of the module 210 and/or the cells 220, transmit collected data, and/or the like.

The pack sensor hardware 230 located within the battery pack 200 may generally sense one or more characteristics of the battery pack 200, the modules 210 therein, the cells 220 therein, and/or one or more other components therein. For example, the pack sensor hardware 230 may include a temperature sensor configured to sense an internal temperature of the battery pack 200 as a whole, or various portions of the battery pack 200 (e.g., to identify "hot spots" within the battery pack 200). That is, temperature sensors may be dispersed throughout the interior of the battery pack 200 to sense the temperature at particular areas within the battery pack 200. In another example, the pack sensor hardware 230 may include an electrical meter configured to sense one or more electrical characteristics of the modules 210 and/or the cells 220 within the battery pack 200, such as, but not limited to, voltage, impedance, and/or the like. In another example, the pack sensor hardware 230 may include one or more pressure monitors that monitors a pressure of each cell 220 within the battery pack 200. In yet another example, the pack sensor hardware 230 may include one or more ultrasonic electrochemical impedance spectroscopy (EIS) devices.

In some embodiments, the pack sensor hardware 230 may be integrated with the module BMS device 212 of each of the modules 210 such that sensing on a cell level or a module level can be achieved. In some embodiments, the pack sensor hardware 230 may be integrated with the BMS hardware components 240. The pack sensor hardware 230 may be communicatively coupled to one or more devices to transmit data corresponding to the sensed characteristics such that the data can be utilized as described herein. For example, the pack sensor hardware 230 may be communicatively coupled to the BMS hardware components 240, which provides the data to one or more external components such as, but not limited to, the battery configuration system 110 (FIG. 1).

Still referring to FIG. 2, the BMS hardware components 240 are generally any electronic system components that are configured to manage the modules 210 and the cells 220 of the battery pack 200, including components that are now known or later developed. As such, the BMS hardware components 240 may generally include components that are particularly configured for maintaining operation of the battery pack 200, monitoring a state of the battery pack 200 (as well as the modules 210 and cells 220 therein), calculating secondary data, transmitting calculated data and/or data received from the pack sensor hardware 230, maintaining the operating environment within the battery pack 200, authenticating the battery pack 200, and/or balancing the battery pack 200.

In some embodiments, the BMS hardware components 240, in conjunction with the pack sensor hardware 230, may monitor and/or control various battery operating parameters of the battery pack 200, the modules 210 thereof, and/or the cells 220 thereof. For example, the BMS hardware components 240 may monitor and/or control voltage (e.g., total voltage, voltage of particular modules 210, voltage of particular cells 220, minimum cell voltage, maximum cell voltage, voltage of periodic taps, and/or the like), temperature (e.g., average temperature, coolant intake temperature, coolant output temperature, coolant flow, temperatures of each module 210, temperatures of each cell 220, and/or the like), state of charge (SOC) or depth of discharge (DOD), state of health (SOH), state of power (SOP), (e.g., current in or out of the battery pack 200, the modules 210 thereof, and/or the cells 220 thereof), and/or recharging parameters (e.g., directing recovered energy and/or the like).

In some embodiments, the BMS hardware components 240 may calculate various values, including, but not limited to, maximum charge current as a charge current limit (CCL), maximum discharge current as a discharge current limit (DCL), energy (e.g., kilowatt-hours (kWh)) delivered since last charge or charge cycle, internal impedance of a module 210 and/or a cell 220, open circuit voltage, charge delivered or stored (e.g., Coulomb counter), total energy delivered since first use, total operating time since first use, total number of cycles, and/or the like.

In embodiments, the BMS hardware components 240 may include a central controller that communicates internally within the battery pack 200 with various other hardware, such as for example, hardware associated with a module 210 and/or a cell 220 (e.g., the module BMS device 212) and/or externally with external components, such as, for example, the various components depicted in FIG. 1. Still referring to FIG. 2, the central controller may communicate via a serial connection, a CAN bus, a DC-Bus (e.g., serial over power line), and/or wirelessly.

The BMS hardware components 240 may also be used to optimize usage of the battery pack 200 (e.g., charging the battery pack 200, discharging the battery pack, and/or the like) by wasting energy from the most charged modules 210 and/or cells 220 by connecting the modules 210 and/or cells 220 to a load (e.g., via passive regulators or the like), shuffling energy from relatively more charged modules 210 and/or cells 220 to relatively less charged modules 210 and/or cells, reducing charging currents such that relatively higher charged modules 210 and/or cells 220 are not damaged, but relatively lower charged modules 210 and/or cells 220 can still to charge, modular charging, and/or the like.

The topology of the BMS hardware components 240 should generally be understood, and is not limited by the present disclosure. That is, the BMS hardware components 240 may a centralized topology whereby a single controller is coupled to all of the modules 210 and cells 220, a distributed topology whereby a BMS board is installed at each module 210 and/or cell (e.g., the module BMS device 212), or a modular topology whereby the BMS hardware components 240 include a plurality of controllers, each of which handles a subset of the total number of modules 210 and cells 220 within the battery pack 200.

In some embodiments, the battery pack 200 may further include one or more ports for transmitting electricity stored in the cells 220, transmitting data (e.g., from the BMS hardware components 240), and/or the like. For example, as depicted in FIG. 2, the battery pack 200 may include an electrical port 204, a data port 206, and/or an auxiliary port 208.

The electrical port 204 is generally provides an electrical coupling to the various components within the battery pack 200, including, but not limited to, the modules 210 and the cells 220. Thus, the electrical port 204, when electrically coupled to an external device, may allow electrical currents to flow between the battery pack 200 and the external device. As such, the electrical port 204 may be shaped, sized, and arranged to electrically couple to one or more components of a vehicle and/or battery testing device.

The data port 206 generally provides a data connection between the components within the battery pack 200 and one or more external components. That is, data gathered and/or generated by various components within the battery pack 200 (e.g., the BMS hardware components 240, each module BMS device 212, data from the pack sensor hardware 230, and/or the like) may be transmitted out of the battery pack 200 via the data port 206 to external components such as (but not limited to), the various components shown and described with respect to FIG. 1. That is, referring also to FIG. 1, the data may be transmitted to the battery configuration system 110, other components of a vehicle 122 in the fleet of vehicles 120, the one or more user computing devices 130, the one or more mobile devices 140, the one or more machine learning servers 150, and/or the one or more battery testing devices 160 via the data port 206. In some embodiments, the data from the components within the battery pack 200 may be transmitted by one device to another device. For example, the data port 206 may be communicatively coupled to a vehicle's CAN bus (or other similar local interface) such that the data from the components within the battery pack 200 are transmitted via the CAN bus where it is retrieved via a connection between the vehicle's CAN bus and another component (e.g., a user computing device 130 or a mobile device connected to the CAN bus via an access port such as the vehicle's OBD port). The data may then be relayed via the network 100 to yet another component such as the battery configuration system 110. In another example, the data port 206 may be communicatively coupled to one or more of the battery testing devices 160 such that data from the components within the battery pack 200 are transmitted to the one or more battery testing devices 160.

The auxiliary port 208 may generally be any type of port for any type of communication or electrical coupling. In some embodiments, the auxiliary port 208 may be used for a combination of communications and electrical coupling (e.g., serial communication over powerline).

It should now be understood the type of battery pack that is generally used for the purposes described herein. However, it should also be understood that the battery pack described with respect to FIG. 2 is merely illustrative, and other battery packs now known or later developed may also be used without departing from the scope of the present disclosure.

Figure 3A:
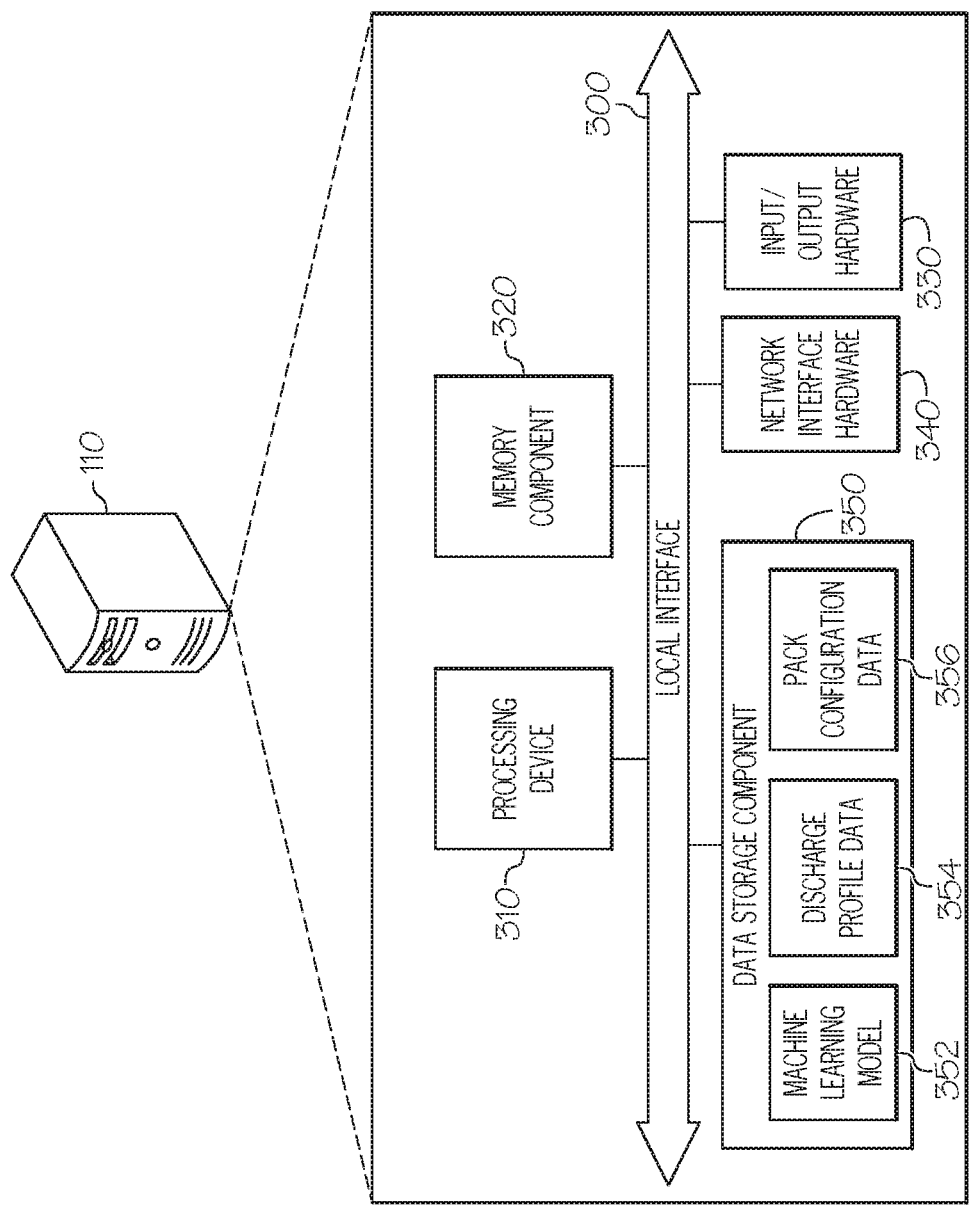
FIG. 3A schematically depicts illustrative hardware components of a battery configuration system that predicts a discharge profile of a battery pack under particular operating conditions according to one or more embodiments shown and described herein.

FIG. 3A depicts illustrative internal components of the battery configuration system 110 of FIG. 1 that provide the battery configuration system 110 with the capabilities described herein. As depicted in FIG. 3A, the battery configuration system 110 may include a processing device 310, a non-transitory memory component 320, network interface hardware 340, input/output (I/O) hardware 330, and/or a data storage component 350. A local interface 300, such as a bus or the like, may interconnect the various components.

The processing device 310, such as a computer processing unit (CPU), may be the central processing unit of the battery configuration system 110, performing calculations and logic operations to execute a program. The processing device 310, alone or in conjunction with the other components, is an illustrative processing device, computing device, processor, or combination thereof. The processing device 310 may include any processing component configured to receive and execute instructions (such as from the data storage component 350 and/or the memory component 320).

The memory component 320 may be configured as a volatile and/or a nonvolatile computer-readable medium and, as such, may include random access memory (including SRAM, DRAM, and/or other types of random access memory), read only memory (ROM), flash memory, registers, compact discs (CD), digital versatile discs (DVD), and/or other types of storage components. The memory component 320 may include one or more programming instructions thereon that, when executed by the processing device 310, cause the processing device 310 to complete various processes, such as the processes described herein with respect to FIG. 5.

Figure 3B:
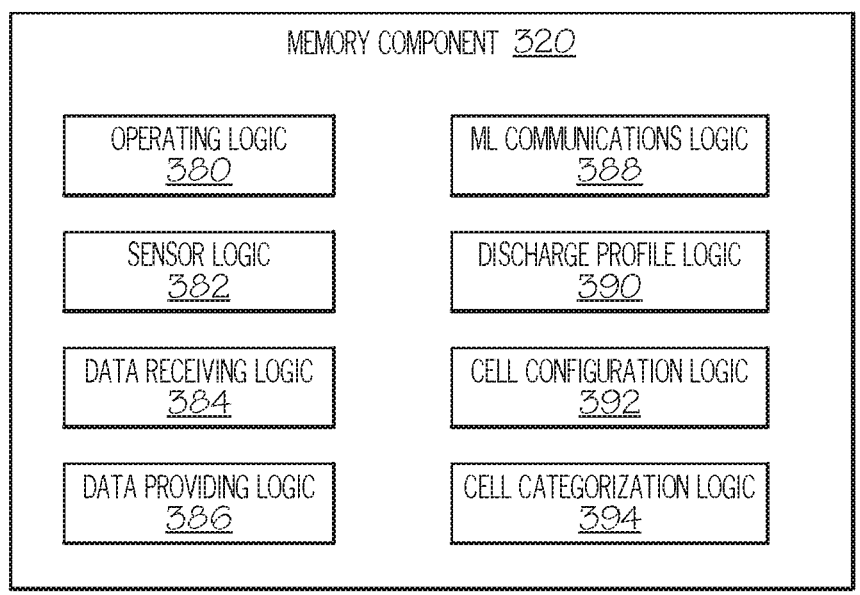
FIG. 3B depicts a block diagram of illustrative logic contained within a memory of a battery configuration system that predicts a discharge profile of a battery pack under particular operating conditions according to one or more embodiments shown and described herein.

Referring to FIGS. 3A-3B, the programming instructions stored on the memory component 420 may be embodied as a plurality of software logic modules, where each logic module provides programming instructions for completing one or more tasks. Illustrative logic modules depicted in FIG. 3B include, but are not limited to, operating logic 380, sensor logic 382, data receiving logic 384, data providing logic 386, machine learning communications logic 388, discharge profile logic 390, cell configuration logic 392, and/or cell categorization logic 394. Each of the logic modules depicted in FIG. 3B may be embodied as a computer program, firmware, or hardware, as an example.

The operating logic 380 may include an operating system and/or other software for managing components of the battery configuration system 110. The sensor logic 382 may include one or more programming instructions for direction operation of one or more sensors, such as sensors included within a vehicle (e.g., one of the fleet of vehicles 120 (FIG. 1)), sensors included within a battery pack 200 (FIG. 2), and/or the like. Referring to FIGS. 1 and 3B, the data receiving logic 384 may generally include programming instructions for receiving data from one or more components external to the battery configuration system 110, such as, for example, data transmitted by any vehicle 122 from the fleet of vehicles 120, the one or more user computing devices 130, the one or more mobile devices 140, the one or more battery testing devices 160, a battery pack 200 (FIG. 2) and/or the like. Still referring to FIGS. 1 and 3B, the data providing logic 386 may generally include programming instructions for transmitting data to one or more components external to the battery configuration system 110, such as, for example, data to any vehicle 122 from the fleet of vehicles 120, the one or more user computing devices 130, the one or more mobile devices 140, the one or more battery testing devices 160, a battery pack 200 (FIG. 2) and/or the like. Still referring to FIGS. 1 and 3B, the machine learning communications logic 388 may generally include programming instructions for communicating with the one or more machine learning servers 150, such as instructions for transmitting data to the one or more machine learning servers 150, transmitting instructions to the one or more machine learning servers 150, receiving data or information from the one or more machine learning servers 150, directing operation of the one or more machine learning servers 150, and/or the like.

The discharge profile logic 390 may generally include one or more programming instructions for determining a discharge profile for a particular type of battery pack for a particular type of driving conditions based on the predictive model received from the one or more machine learning servers 150, as described in greater detail herein. In addition, the discharge profile logic 390 may further include one or more programming instructions for generating one or more subspaces in each discharge profile, as described in greater detail herein. The cell configuration logic 392 may generally include one or more programming instructions for determining a configuration of cells 220 and/or modules 210 within a battery pack 200, as described in greater detail herein. The cell categorization logic 394 may generally include one or more programming instructions for categorizing cells 220 based on one or more characteristics of the cells 220, as described in greater detail herein.

Referring again to FIG. 3A, the input/output hardware 330 may communicate information between the local interface 300 and one or more other components of the battery configuration system 110 not described herein. In some embodiments, the input/output hardware 330 may be used for one or more user interface components, including local user interface components and/or one or more remote user interface components.

The network interface hardware 340 may include any wired or wireless networking hardware, such as a modem, LAN port, wireless fidelity (Wi-Fi) card, WiMax card, mobile communications hardware, and/or other hardware for communicating with other networks and/or devices. For example, the network interface hardware 340 may be used to facilitate communication between the various other components described herein with respect to FIG. 1.

The data storage component 350, which may generally be a storage medium, may contain one or more data repositories for storing data that is received and/or generated. The data storage component 350 may be any physical storage medium, including, but not limited to, a hard disk drive (HDD), memory, removable storage, and/or the like. While the data storage component 350 is depicted as a local device, it should be understood that the data storage component 350 may be a remote storage device, such as, for example, a server computing device, cloud based storage device, or the like. Illustrative data that may be contained within the data storage component 350 includes, but is not limited to, machine learning model data 352, discharge profile data 354, and/or pack configuration data 356. The machine learning model data 352 may generally pertain to data that is generated by the one or more machine learning servers 150 (FIG. 1) and/or data that is used for the purposes of generating a machine learning model. Still referring to FIG. 3A, the discharge profile data 354 is generally generated data that relates to a predicted discharge of a particular pack configuration, given a particular operating condition, as described herein. The discharge profile data 354 may further include data relating to subspaces in a particular discharge profile, as described herein. In some embodiments, the discharge profile data may be generated as a result of operating according to the discharge profile logic 390 (FIG. 3B). Still referring to FIG. 3A, the pack configuration data generally contains information pertaining to a particular configuration of a battery pack 200 (FIG. 2) based on information that has been received from the one or more machine learning servers 150 (FIG. 1), data that is generated as a result of operating according to the cell configuration logic 392 and/or the cell categorization logic 394 (FIG. 3B), and/or the like.

It should be understood that the components illustrated in FIGS. 3A-3B are merely illustrative and are not intended to limit the scope of this disclosure. More specifically, while the components in FIGS. 3A-3B are illustrated as residing within the battery configuration system 110, this is a non-limiting example. In some embodiments, one or more of the components may reside external to the battery configuration system 110.

Figure 4:
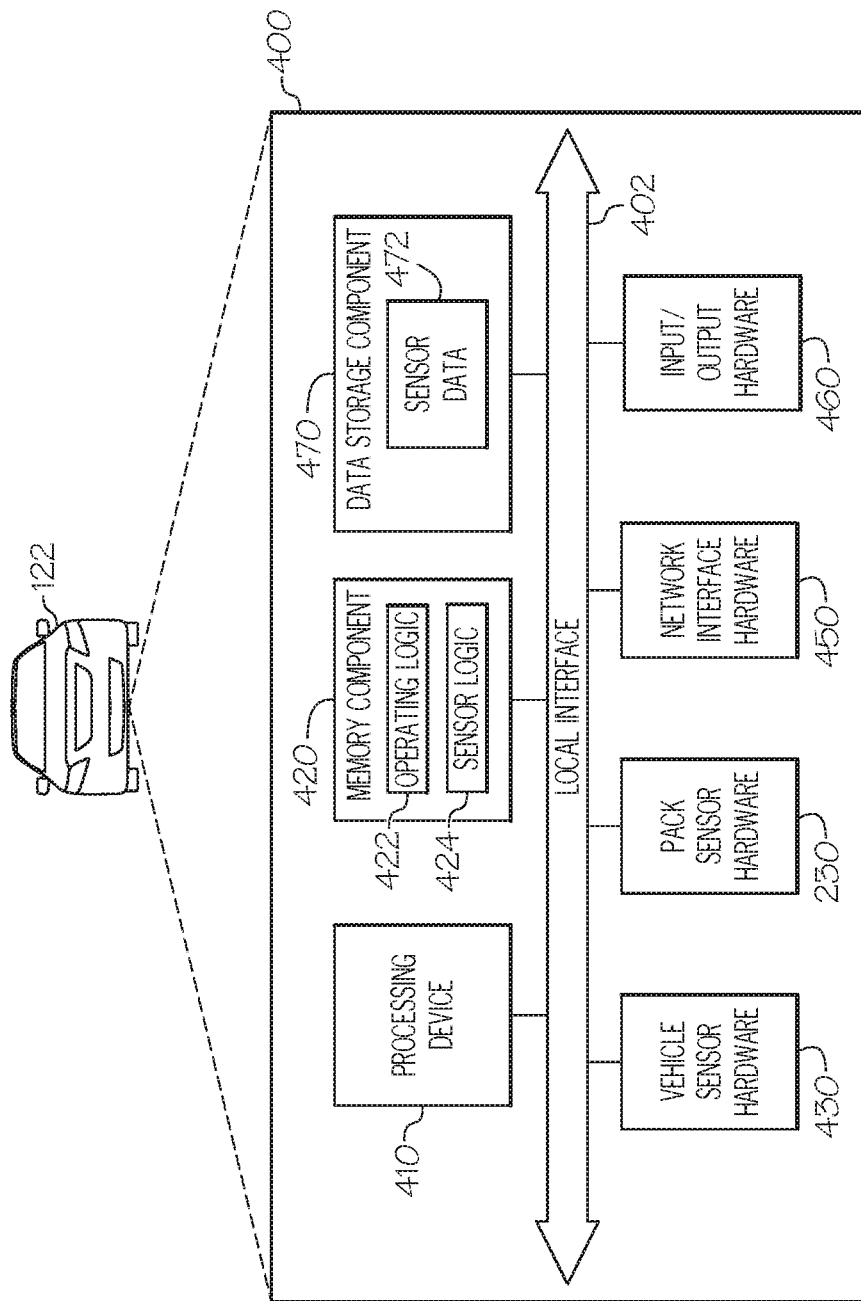
FIG. 4 schematically depicts illustrative hardware components of an illustrative vehicle management module in a vehicle having a battery pack according to one or more embodiments shown and described herein.

FIG. 4 depicts illustrative internal components of a vehicle battery management module 400 within a vehicle 122 in the fleet of vehicles 120 (FIG. 1) according to various embodiments. The vehicle battery management module 400 is generally separate from the BMS hardware components 240 located in the battery pack 200 depicted in FIG. 2, but works in tandem with the BMS hardware components 240 to provide the functionality described herein. As illustrated in FIG. 4, the vehicle battery management module 400 may include a processing device 410, a non-transitory memory component 420, vehicle sensor hardware 430, the pack sensor hardware 230, network interface hardware 450, input/output (I/O) hardware 460, and/or a data storage component 470. A local interface 402, such as a bus or the like (e.g., the vehicle CAN bus), may interconnect the various components.

The processing device 410, such as a computer processing unit (CPU), may be the central processing unit of the vehicle battery management module 400, performing calculations and logic operations to execute a program. The processing device 410, alone or in conjunction with the other components, is an illustrative processing device, computing device, processor, or combination thereof. The processing device 410 may include any processing component configured to receive and execute instructions (such as from the data storage component 470 and/or the memory component 420).

The memory component 420 may be configured as a volatile and/or a nonvolatile computer-readable medium and, as such, may include random access memory (including SRAM, DRAM, and/or other types of random access memory), read only memory (ROM), flash memory, registers, compact discs (CD), digital versatile discs (DVD), and/or other types of storage components. The memory component 420 may include one or more programming instructions thereon that, when executed by the processing device 410, cause the processing device 410 to complete various processes, such as the processes described herein with respect to FIG. 5.

Still referring to FIG. 4, the programming instructions stored on the memory component 420 may be embodied as a plurality of software logic modules, where each logic module provides programming instructions for completing one or more tasks. Illustrative logic modules depicted in FIG. 4 include, but are not limited to, operating logic 422 and/or sensor logic 424. Each of the logic modules shown in FIG. 4 may be embodied as a computer program, firmware, or hardware, as an example. The operating logic 422 may include an operating system and/or other software for managing components of the vehicle battery management module 400. The sensor logic 424 may include one or more programming instructions for directing operation of the vehicle sensor hardware 430 and/or the pack sensor hardware 230, including, but not limited to, directing the vehicle sensor hardware 430 and/or the pack sensor hardware 230 to sense one or more characteristics of the vehicle 122 and/or the battery pack 200 (FIG. 2), transmit data corresponding to the one or more sensed characteristics, and/or the like.

Still referring to FIG. 4, the vehicle sensor hardware 430 may generally include one or more hardware components that sense one or more vehicle characteristics, particularly characteristics that provide information that can be used to determine a functioning of the battery pack 200 (FIG. 2) in particular operating conditions and/or complete the various processes described herein. Illustrative hardware components include, but are not limited to, a camera (including video and still cameras), an optical sensor, a ranging system, a time-of-flight (TOF) sensor, a proximity sensor, a temperature sensor, a pressure sensor, global positioning satellite (GPS) components, electrical sensors (e.g., voltage sensors, impedance sensors, and/or the like), accelerometers, gyroscopes, speed sensors, and/or the like. Other sensors, particularly those used for the purposes of obtaining information relating to battery function, vehicle function, terrain on which the vehicle is driving, and/or the like are also included without departing from the scope of the present disclosure. In some embodiments, the vehicle sensor hardware 430 may receive sensed information and transmit signals and/or data corresponding to the sensed information to one or more components described herein. For example, the vehicle sensor hardware 430 may receive acceleration and/or speed information pertaining to the vehicle and generate one or more signals and/or data to transmit to the processing device 410 for processing the data, transmitting the data to other components, and/or the like, as described in greater detail herein.

The network interface hardware 450 may include any wired or wireless networking hardware, such as a modem, LAN port, wireless fidelity (Wi-Fi) card, WiMax card, mobile communications hardware, and/or other hardware for communicating with other networks and/or devices. For example, the network interface hardware 450 may be used to facilitate communication between the various other components described herein with respect to FIG. 1.

Still referring to FIG. 4, the input/output hardware 460 may communicate information between the local interface 402 and one or more other components of the vehicle 122 not described herein. For example, one or more vehicle components located within the vehicle 122 but not part of the vehicle battery management module 400 may communicate with the various components of the vehicle battery management module 400 via the input/output hardware 460. In some embodiments, the vehicle sensor hardware 430 may be located outside the vehicle battery management module 400 and may communicate (e.g., transmit signals and/or data) with the various components of the vehicle battery management module 400 via the input/output hardware 460.

The data storage component 470, which may generally be a storage medium, may contain one or more data repositories for storing data that is received and/or generated. The data storage component 470 may be any physical storage medium, including, but not limited to, a hard disk drive (HDD), memory, removable storage, and/or the like. While the data storage component 470 is depicted as a local device, it should be understood that the data storage component 470 may be a remote storage device, such as, for example, a server computing device, cloud based storage device, or the like. Illustrative data that may be contained within the data storage component 470 includes, but is not limited to, sensor data 472 and/or other data. The sensor data 472 may generally include data that is obtained from the vehicle sensor hardware 430 and/or the pack sensor hardware 230. Nonlimiting examples of data contained within the sensor data 472 may include vehicle operations data (e.g., accelerometer data, gyroscope data, speed data, GPS data, and/or the like), image data pertaining to an environment in which the vehicle 122 is operating, and battery operations data (e.g., temperature data, voltage data, impedance data, and/or the like).

It should be understood that the components illustrated in FIG. 4 are merely illustrative and are not intended to limit the scope of this disclosure. More specifically, while the components in FIG. 4 are illustrated as residing within the vehicle battery management module 400 within the vehicle 122, this is a nonlimiting example. In some embodiments, one or more of the components may reside external to the vehicle battery management module 400 and/or the vehicle 122.

Figure 5:
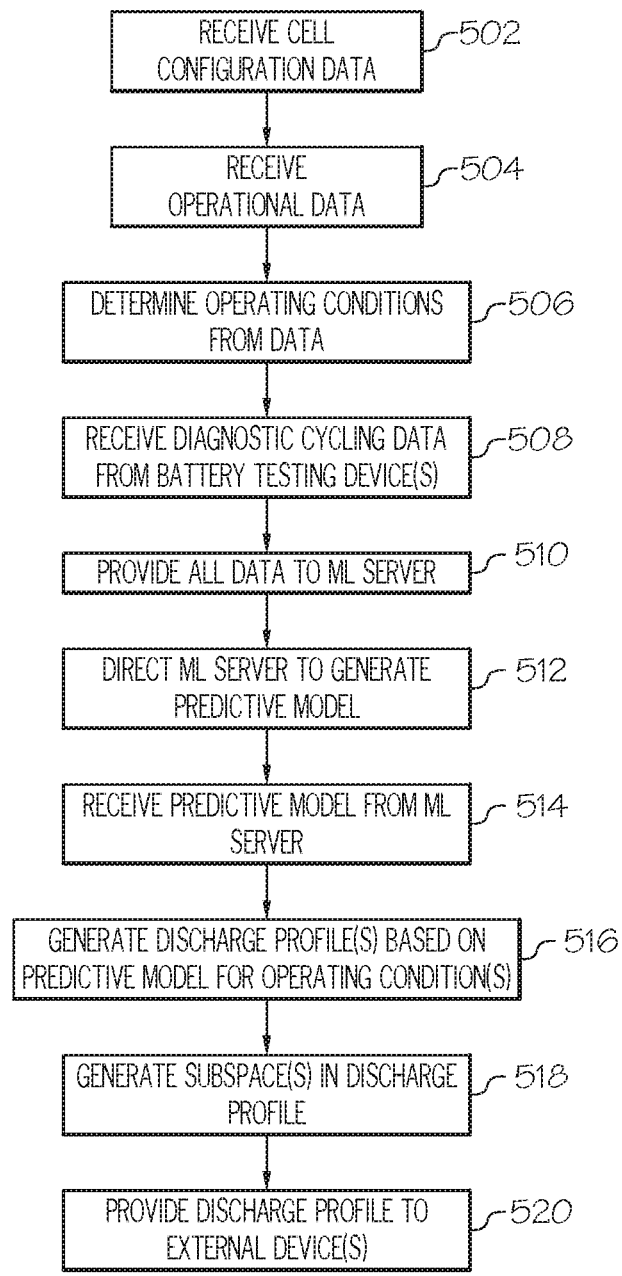
FIG. 5 depicts a flow diagram of an illustrative method of predicting a discharge profile of a battery pack under particular operating conditions according to one or more embodiments shown and described herein.

As mentioned above, the various components described with respect to FIGS. 1-4 may be used to carry out one or more processes and/or provide functionality for predicting a discharge profile of a particularly configured battery pack under particular operating conditions. An illustrative example of the various processes are described with respect to FIG. 5 hereinbelow. The various processes described with respect to FIG. 5 may generally be completed by one or more of the components depicted in FIGS. 1-4. FIG. 5 depicts an illustrative method of predicting a discharge profile of a particularly configured battery pack under particular operating conditions according to various embodiments. The various steps described with respect to FIG. 5 are merely illustrative, and additional, fewer, or alternative steps are contemplated without departing from the scope of the present disclosure.

While also generally referring to FIGS. 1-4, at block 502, cell configuration data may be received for one or more battery packs 200. That is, the battery configuration system 110 may receive data from each battery pack 200 (e.g., the BMS hardware components 240) that pertains to how the various cells 220 are configured within the modules 210 in the battery pack 200. The cell configuration data generally includes information pertaining to the arrangement of particular cells 220 in a module 210, the arrangement of particular modules 210 in the battery pack 200, the capacity of each cell 220 in a module 210, the capacity of each module 210, the output of each cell 220 in a module 210, the output of each module 210, and/or the like.

The cell configuration data may generally be received directly from the vehicle 122 containing the battery pack 200 (e.g., via a data connection between the vehicle 122 and the battery configuration system 110), from at least one of the one or more user computing devices 130, and/or from at least one of the one or more mobile devices 140 (e.g., when the vehicle 122 is connected to a user computing device 130 or a mobile computing device by the OBD port in the vehicle 122). For example, if the vehicle 122 has a constant data connection (or is connected to a mobile device 140 that provides a constant data connection), data from the battery pack 200 installed therein may be continuously transmitted according to block 502, or may be transmitted at particular intervals (e.g., hourly, daily, weekly, monthly, or the like). In another example, data from the vehicle 122 may be transmitted when the vehicle is in a technician's shop or other location containing a user computing device 130 or a mobile device 140 that obtains the data from the vehicle and relays the data to the battery configuration system 110. In yet another example, in embodiments where the user computing device 130 or the mobile computing device is a charging station, the data may be offloaded from the vehicle 122 to the battery configuration system 110 when the vehicle is connected to the charging station for charging.

At block 504, operational data may be received. That is, the battery configuration system 110 may receive data from each battery pack 200 (e.g., the BMS hardware components 240) that pertains to how the various cells 220 are operating when the battery pack 200 is used (e.g., charged and discharged). As such, the operational data contains data from various sensors (e.g., the pack sensor hardware 230, the module BMS device 212, and/or the like) that are configured to monitor various electrical characteristics of each of the cells 220, the modules 210, and/or the like. For example, the operational data may include voltage information for each of the modules 210 and/or cells 220 within the battery pack 200, impedance information for each of the modules 210 and/or cells 220 within the battery pack 200, operating temperatures within the battery pack 200, including operating temperatures of various modules 210 and/or cells 220, an amount of time necessary to discharge each module 210 and/or cell 220 in particular operating conditions, an amount of time necessary to charge each module 210 and/or cell 220 in particular operating conditions, and/or the like. In some embodiments, the operational data may be obtained from various ones of the vehicle sensor hardware 430 such that operating conditions of the vehicle 122 can be determined. For example, the data received from the vehicle sensor hardware 430 may be indicative of an environmental temperature outside the vehicle 122, the type of terrain the vehicle 122 is traversing, whether the vehicle 122 is in stop-and-go traffic, the gradation of the road the vehicle 122 is traversing, how fast the vehicle 122 drives, how quickly the vehicle 122 accelerates and/or decelerates, and/or the like.

The operational data may generally be received directly from the vehicle 122 containing the battery pack 200 (e.g., via a data connection between the vehicle 122 and the battery configuration system 110), from at least one of the one or more user computing devices 130, and/or from at least one of the one or more mobile devices 140 (e.g., when the vehicle 122 is connected to a user computing device 130 or a mobile computing device by the OBD port in the vehicle 122). For example, if the vehicle 122 has a constant data connection (or is connected to a mobile device 140 that provides a constant data connection), data from the battery pack 200 installed therein may be continuously transmitted according to block 502, or may be transmitted at particular intervals (e.g., hourly, daily, weekly, monthly, or the like). In another example, data from the vehicle 122 may be transmitted when the vehicle is in a technician's shop or other location containing a user computing device 130 or a mobile device 140 that obtains the data from the vehicle and relays the data to the battery configuration system 110. In yet another example, in embodiments where the user computing device 130 or the mobile computing device is a charging station, the data may be offloaded from the vehicle 122 to the battery configuration system 110 when the vehicle is connected to the charging station for charging.

It should be understood that in some embodiments, the cell configuration data received according to block 502 and the operational data received according to block 504 may occur substantially simultaneously. That is, the data stream received by the battery configuration system 110 may include both cell configuration data and operational data in some embodiments.

At block 506, the operating conditions in which the vehicle 122 is operating may be determined from the operational data. For example, data from one or more sensors may be used to determine one or more operating condition segments, a terrain for each segment, an amount of traffic in each segment, an ambient temperature outside the vehicle for each segment, length of time the vehicle 122 is driven, the speed (or average speed) the vehicle 122 is driven, the temperature of the battery pack 200, components thereof, the operating temperature of various vehicle components, and/or or the like.

At block 508, diagnostic cycling data and/or other data is obtained from the one or more battery testing devices 160. That is, the one or more battery testing devices 160 mimic one or more driving patterns when applying a load to a battery pack 200 being tested, collect data regarding the discharge of the battery pack 200 in response to the one or more mimicked driving patterns, and transmit the data to the battery configuration system 110. In some embodiments, the one or more battery testing devices 160 transforms an amount of time that would normally occur to fully cycle a cell into a plurality of cells being cycled such that the total amount of time necessary to do a cycle of learning is shortened, relative to a vehicle 122 cycling cells in a battery pack 200. As such, the one or more battery testing devices 160 are able to generate significantly more data regarding battery pack discharge for a plurality of operating conditions relative to the amount of data that is generated from each vehicle 122 in the fleet of vehicles 120. For example, the one or more battery testing devices 160, instead of taking the full amount of time to cycle cells, explores all of the possible cycling conditions that may be encountered in a vehicle and test a plurality of cells substantially simultaneously instead of a single cycle or a plurality of cycles on a particular cell. In some embodiments, the one or more battery testing devices 160 may mimic the one or more driving patterns based on the cell configuration data received at block 502 and the operational data received at block 504.

It should be understood that the term "diagnostic cycling" generally refers to an intentional cycling of a particular battery pack 200 in a particular standardized way, rather than a dynamic cycling that the same battery pack 200 would experience if used in a driven vehicle 122. That is, under real-world conditions, such as the conditions that result in the operational data received in block 504, the current or power being drawn from the battery pack 200 or placed into the battery pack 200 varies with time. As a result, the battery pack 200 may not be fully charged and/or fully discharged every time it is cycled. In contrast, with diagnostic cycling, the battery pack 200 may be fully charged and fully discharged in every cycle.

At block 510, all of the data obtained may be provided to the one or more machine learning servers 150. That is, the cell configuration data received at block 502, the operational data received at block 506, data pertaining to determined operating conditions pursuant to block 506, and diagnostic cycling data from the one or more battery testing devices 160 received at block 508 may be provided to the one or more machine learning servers 150. In some embodiments, the data may be transmitted from the various devices (e.g., the vehicles 122, the one or more user computing devices 130, the one or more mobile devices 140, the one or more battery testing devices 160, and/or the like) directly to the one or more machine learning servers 150 via the network 100. In other embodiments, the data may be collected by the battery configuration system 110 and then transmitted to the one or more machine learning servers 150 via the network 100.

Once the one or more machine learning servers 150 receive the data, the one or more machine learning servers 150 may be directed by the battery configuration system 110 to generate a predictive model at block 512. That is, a signal may be transmitted from the battery configuration system 110 to the one or more machine learning servers 150 (e.g., via the network 100) that causes the machine learning servers 150 to feed the received data (e.g., the cell configuration data, the operational data, data pertaining to operating conditions, and/or data from the one or more battery testing devices 160 (e.g., cell configuration data and/or other data)) into a predictive model and/or generate a predictive model from the data. The predictive model may generally be any machine learning model now known or later developed, particularly one that provides resulting information that can be used to determine optimum battery pack configuration for a particular use. Illustrative general examples of machine learning models include, but are not limited to, a convolutional neural network (CNN) model, a long short-term memory (LSTM) model, a neural network (NN) model, a dynamic time warping (DTW) model, or the like. Specific examples include, but are not limited to, descriptor-based models and LFTM models, as described herein.

Various machine learning implementations of Q-V based early prediction strategies may be used. For example, the one or more battery testing devices 160 may follow a dynamic/stochastic (driving inspired) discharge profile and features in that data that represent early failure may be discovered. In another example, a diagnostic discharge cycle for a module 210 approximately every nth cycle (e.g., 100, 500, 1000, or the like) and fill-in between may be completed, with driving-inspired discharge/charge profiles in between, which allows use of an early-prediction method (or any future Q-V based feature-engineered ML method). In yet another example, completing the diagnostics during a charge step for every nth cycle (e.g., every $100^{th}$ cycle for a module), which is already controlled, and complete the driving-inspired charge/discharge in between.

From the data, it may be possible to determine how a particular battery pack discharges over a known terrain with traffic (e.g., rush hour traffic) versus the same terrain without traffic. The data may also indicate how the battery pack 200 discharges when fully charged (e.g., having 100% charge) versus when it is less than fully charged (e.g., about 30% charged, about 50% charged, or the like). In each of these situations, different loads may be sensed for the battery, different requirements in terms of current, different operating conditions, different temperature, and/or the like are imposed on the battery pack 200.

Since the data is collected for a large number of vehicles 122/battery packs 200, each with their own particular driving characteristics (e.g., due to different drivers in each vehicle 122, locations where the vehicle 122 is driven, different driving conditions, different simulated conditions, and/or the like), the ML algorithms can be utilized to determine a predicted discharge based on a given set of driving/vehicle characteristics.

The predictive model may be transmitted to the battery configuration system 110 for further use as described hereinbelow. In some embodiments, the predictive model may be stored in a battery database or the like such that it can be subsequently retrieved for updating, subsequent use by the battery configuration system 110, accessed by a vehicle 122 from the fleet of vehicles 120, and/or the like. For example, the predictive model may be stored as part of the machine learning model data 352 within the data storage component 350 of the battery configuration system 110.

At block 514, the battery configuration system 110 may receive the predictive model from the one or more machine learning servers 150 (or retrieve the predictive model from data storage). The battery configuration system 110 may generate one or more predicted discharge profiles based on the predictive model for each of one or more operating conditions at block 516. For example, a representative profile may be established for a drive whereby the vehicle 122 is driven on surface streets for 10 minutes, another representative profile may be established for another driver whereby the vehicle 122 is driven on a freeway for 20 minutes, or the like. Data relating to the discharge of the battery pack 200 for each of these profiles is also obtained and can be fed back to the one or more machine learning servers 150 to update the predictive model and predict how the battery pack 200 will discharge under certain other arbitrary conditions.

At block 518, one or more subspaces in each discharge profile may be generated. Each subspace is created out of principal components using dynamic time warping (DTW), ECW, distance, and/or the like to compare or extract relevant information from different battery packs 200 or different cycles to forecast (e.g., cycles to failure, capacity, fade, and/or the like). As such, a particular driving profile can be categorized into different bins.

At block 520, each discharge profile (and any subspaces thereof) are provided to one or more external devices. For example, one or more discharge profiles may be provided to the battery configuration system 110 for further use, the one or more machine learning servers 150 for further use, the one or more battery testing devices 160 for further use, and/or the like. In another example, one or more discharge profiles may be stored in a storage device, such as, for example, the data storage component 350. In yet another example, one or more discharge profiles may be transmitted to an external computing device, such as a manufacturing computing device or the like that uses the one or more discharge profiles to construct a battery pack in a particular manner such that the battery pack is suited for a particular intended use. In embodiments where one or more discharge profiles (and any subspaces thereof) are transmitted to the one or more battery testing devices 160, additional controlled testing may be completed on battery packs 200 to ascertain how a particular battery pack will respond, given a set of particular driving profile or subspace thereof.

It should now be understood that the systems and methods described herein train and use a machine learning model to predict how certain conditions will cause a particular battery pack to discharge when the battery pack is operated in an electric vehicle or gas-electric hybrid vehicle. The methods and systems generally include obtaining data pertaining to the cells in battery packs installed in a fleet of currently-operating vehicles, data pertaining to discharge of the cells under real-world conditions, and/or data pertaining to discharge of the cells under simulated conditions. The data is then fed into a ML server, which generates a predictive model that can be used to establish discharge profiles for particular operating conditions.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method, comprising:
receiving data pertaining to cells within a battery pack installed in each vehicle of a fleet operating under a plurality of conditions, the data received from at least one vehicle in the fleet;
providing the data to a machine learning server;
directing the machine learning server to generate a predictive model based on machine learning of the data;
generating a predicted discharge profile of a vehicle battery pack from the predictive model; and
providing the discharge profile to an external device for constructing, testing, and/or using battery packs.

2. The method of claim 1, further comprising storing the data, the predictive model, and the discharge profile in a battery database.

3. The method of claim 1, further comprising generating, by the processing device, one or more subspaces in the discharge profile.

4. The method of claim 1, wherein receiving the data pertaining to the cells within the battery pack comprises receiving at least one of cell configuration data and operational data.

5. The method of claim 4, wherein the operational data is used to determine operating conditions of the vehicle.

6. The method of claim 1, wherein receiving the data comprises receiving supplemental data from one or more vehicle-specific sensors in each vehicle of the fleet of vehicles.

7. The method of claim 1, further comprising receiving diagnostic cycling data from one or more battery testing devices configured to simulate discharge conditions of one or more additional battery packs.

8. The method of claim 1, wherein the data pertaining to the cells within the battery pack indicates how the battery pack discharges when fully charged versus how the battery pack discharges when less than fully charged.

9. A system configured for generating a predicted discharge profile of a vehicle battery pack, the system comprising:
a fleet of vehicles, each vehicle in the fleet of vehicles comprising a battery pack having a plurality of cells; and
one or more hardware processors communicatively coupled to each vehicle in the fleet of vehicles, the one or more hardware processors configured by machine-readable instructions to:
receive data pertaining to cells within a battery pack installed in each vehicle of a fleet operating under a plurality of conditions, the data received from at least one vehicle in the fleet;
provide the data to a machine learning server;
direct the machine learning server to generate a predictive model, the predictive model based on machine learning of the data;
generate the predicted discharge profile of the vehicle battery pack from the predictive model; and
provide the discharge profile to an external device.

10. The system of claim 9, further comprising a battery database communicatively coupled to the one or more hardware processors, wherein the one or more hardware processors are further configured by machine-readable instructions to store the data, the predictive model, and the discharge profile in the battery database.

11. The system of claim 9, wherein the one or more hardware processors are further configured by machine-readable instructions to generate one or more subspaces in the discharge profile.

12. The system of claim 9, wherein receiving the data pertaining to the cells within the battery pack comprises receiving at least one of cell configuration data and operational data.

13. The system of claim 12, wherein the operational data is used to determine operating conditions of the vehicle.

14. The system of claim 9, wherein receiving the data comprises receiving supplemental data from one or more vehicle-specific sensors in each vehicle of the fleet of vehicles.

15. The system of claim 9, further comprising one or more battery testing devices communicatively coupled to the one or more hardware processors, the one or more battery testing devices configured to simulate discharge conditions of one or more additional battery packs.

16. The system of claim 15, wherein the one or more hardware processors are further configured by machine-readable instructions to receive diagnostic cycling data from the one or more battery testing devices.

17. The system of claim 15, wherein the one or more battery testing devices comprise one or more high-throughput (HT) cyclers.

18. A non-transitory computer-readable storage medium having instructions embodied thereon, the instructions being executable by one or more processors to perform a method for generating a predicted discharge profile of a vehicle battery pack, the method comprising:
- receiving data pertaining to cells within a battery pack installed in each vehicle of a fleet operating under a plurality of conditions, the data received from at least one vehicle in the fleet;
- providing the data to a machine learning server;
- directing the machine learning server to generate a predictive model based on machine learning of the data;
- generating the predicted discharge profile of the vehicle battery pack from the predictive model; and
- providing the discharge profile to an external device for constructing, testing, and/or using battery packs.

19. The non-transitory computer-readable storage medium of claim 18, wherein the method further comprises generating one or more subspaces in the discharge profile.

20. The non-transitory computer-readable storage medium of claim 18, wherein the method further comprises receiving diagnostic cycling data from one or more battery testing devices configured to simulate discharge conditions of one or more additional battery packs.

* * * * *